(12) United States Patent
Yoo et al.

(10) Patent No.: US 6,346,431 B1
(45) Date of Patent: Feb. 12, 2002

(54) QUANTUM DOT INFRARED DETECTION DEVICE AND METHOD FOR FABRICATING THE SAME

(75) Inventors: Tae Kyung Yoo; Jae Eung Oh, both of Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/612,917

(22) Filed: Jul. 10, 2000

(51) Int. Cl.$^7$ .................. H01L 21/00; H01L 31/072
(52) U.S. Cl. ............................... 438/94; 257/21
(58) Field of Search .................... 438/57, 63, 93, 438/94, 493, 503, 507, 962; 257/21, 22, 24, 431, 436

(56) References Cited

U.S. PATENT DOCUMENTS 5,399,880 A * 3/1995 Chand .................. 257/21
5,608,231 A * 3/1997 Ugajin et al. ............. 257/24

\* cited by examiner

*Primary Examiner*—Keith Christianson
(74) *Attorney, Agent, or Firm*—Fleshner & Kim, LLP

(57) ABSTRACT

Quantum dot infrared detection device and method for fabricating the same, which is a new concept of detection device in which quantum dots in the quantum dot part having a stack of alternative quantum dots and separating layers are doped with impurities, so that the quantum dot part itself absorbs infrared ray and serves as a channel for transferring electrons generated by the infrared ray absorption, for enhancing device performance and a device uniformity, and simplifying a device structure and a device fabrication process.

15 Claims, 6 Drawing Sheets

QUANTUM DOT INFRARED DETECTION DEVICE AND METHOD FOR FABRICATING THE SAME

BACKGROUND OF THE INVENTION

1. Field of the Invention

The present invention relates to a quantum dot infrared detection device and a method for fabricating the same, in which a quantum dot is doped or a quantum dot layer itself is formed as an electron moving channel for detecting a weak infrared signal by using the quantum dot channel.

2. Background of the Related Art

Though an infrared ray, with a wavelength ranging from approx. 5~6 μm to a few tens of μm, may be detected in a variety of methods depending on materials of a device for detecting the infrared ray, the infrared device should be cool down to at least 77K, for operating the infrared device at the room temperature for detecting a good quality signal. However, because the cooled down method is a very complicated and the cooling down device is expensive and bulky, the method in which the device is cooled down could not be spread widely, but used for special applications. Therefore, recently, in order to improve such a disadvantages, there have been many researches for a device for detecting an infrared ray.

The operation principle of the device for detecting an infrared ray will be explained. Upon directing an infrared ray onto a quantum dot, a portion of the infrared ray corresponding to an inter-subband transition energy of the quantum dot is absorbed, and converted into electrons(photo current), to facilitate detection of the infrared ray. A structure in which a quantum dot and a pin diode are bonded as shown in FIG. 1 is well known as a related art quantum dot infrared detection device, and recently, a structure in which a quantum dot and HEMT(High Electron Mobility Transistor) are bonded as shown in FIG. 2 has been developed. In the device as shown in FIG. 1 of a type in which the quantum dot and the pin diode are bonded, the electrons produced by an absorbed infrared ray equal to a sub-band energy difference of the quantum dot generates a photo current by a reverse bias of an existing pin detector. However, the device is known that detection of extremely weak signal is almost impossible at a room temperature because of a leakage current coming from a dislocation of an extremely low density which may occur in formation of a quantum dot, or of a leakage current caused by a recombination-generation current generated by a reverse voltage in the pin diode structure. Thus, application of the device to a system which is operated at a room temperature, such as a general use infrared CCD camera, or to a system using a simple cooling system is almost impossible, because the device should be operated only at a low temperature(below approx. 100K) at which the leakage current is low for obtaining a signal characteristic, In the meantime, a device of a form the quantum dot and the HEMT are bonded shown in FIG. 2 is expected to be operative at a room temperature because an electron density in a quantum dot state is in a form of delta function, and a difference of a ground state and a first excited state is greater than a thermal energy at the room temperature in a case an infrared ray corresponding to a subband energy difference is incident from a front or back of a quantum dot region. Particularly, as shown in FIG. 3, this structure is advantageous in that the infrared ray is absorbed in the quantum dot to cause a inter-subband transition, electrons excited by which are tunneled through an undoped GaAs channel, and captured by a voltage difference between a first terminal and a second terminal, or captured by a voltage difference between terminals in the quantum dot region. That is, by transmitting through a clean channel which can transfer the weak signal detected at the quantum dot without a loss of the electrons, the signal can be separated from an environmental noise or the leakage current. In this instance, overall characteristics of the signal is dependent on a signal of the electrons captured at the undoped GaAs channel. because the undoped GaAs channel region restricted by the doped AlGaAs barrier provide a high mobility for moving the electrons without any loss.

However, the above structure causes a problem in that the electrons captured at the quantum dot by the infrared ray absorption are absorbed by other quantum dots or lost in a course of transfer to the channel region, that drops an overall efficiency. That is, such a loss can drop a performance of the detection device, sharply. Another problem is that an externally doped impurity layer(barrier layer) should be disposed in the vicinity of the quantum dot because a ground state should be filled by supplying electrons thereto. That is, though it is possible theoretically, it is very complicated condition that the impurity layer is precisely controlled for supplying optimal electrons to the quantum dot, and disposing the impurity layer in the vicinity of the quantum dot for obtaining uniform characteristics over a large area. And, though the doped impurity layer(barrier layer) should be etched uniformly for the optimal supply of electrons to the quantum dot, the uniform etching of the impurity layer is not easy.

SUMMARY OF THE INVENTION

Accordingly, the present invention is directed to a quantum dot infrared detection device and a method for fabricating the same that substantially obviates one or more of the problems due to limitations and disadvantages of the related art.

An object of the present invention is to provide a quantum dot infrared detection device and a method for fabricating the same, of which structure and fabrication process are simplified for enhancing uniformity.

Another object of the present invention is to provide a quantum dot infrared detection device and a method for fabricating the same, which can provide a two dimensional uniform array device for application to an imager.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the quantum dot infrared detection device includes a buffer layer or an undoped barrier layer on the substrate, a doped quantum dot part on the buffer layer or the undoped barrier layer, an undoped barrier layer on the quantum dot part, and electrodes on regions of the undoped barrier layer.

A doped contact layer is further provided between the undoped barrier layer and the electrodes.

A p type doped layer is formed under the electrode below the p type doped contact layer.

The quantum dot part includes a multilayered structure of alternative stacking of a quantum dot and a separating layer.

In another aspect of the present invention, there is provided a method for fabricating a quantum dot infrared detection device, including the steps of (1) forming a buffer layer or an undoped barrier layer on a substrate, and forming a doped quantum dot part having quantum dots and separating layers stacked alternatively, (2) forming an undoped barrier layer on the quantum dot part, and (3) forming doped contact layers in regions of the undoped barrier layer, and forming electrodes thereon.

The substrate is fonned of one selected from GaAs, InP, Si, $Al_2O_3$, and GaN, the undoped barrier layer is formed of one selected from $Al_yGa_{1-y}As$ (where, $0 \leq y \leq 1$), AlInP, InP, Si, GaN, and AlGaN, the quantum dot is formed of one selected from $In_xGa_{1-x}As$ (where, $0<x \leq 1$), SiGe, $In_nGa_{1-n}N$ (where, $0<n \leq 1$), the separating layer is formed of one selected from $Al_kGa_{1-k}As$ (where, $0 \leq k \leq 1$), Si, $Al_mGa_{1-m}N$ (where, $0 \leq m \leq 1$), InP, AlInP, and the buffer layer is formed of GaAs, AlGaAs, InP, and GaN.

The quantum dot is of 'n' type, and has an impurity concentration of $10^{15}/cm^3 \sim 10^{18}/cm^3$.

The aforementioned quantum dot infrared detection device and method for fabricating the same have the following advantages.

By doping the quantum dots in the quantum dot part with impurities, the quantum dot part itself is made to absorb infrared ray and serve as a channel for transferring electrons generated by the infrared ray absorption, for enhancing device performance and a device uniformity, and simplifying a device structure and a device fabrication process.

Therefore, the quantum dot infrared detection device and method for fabricating the same is suitable for application to imagers, such as CCD camera, as it permits to provide two dimensional uniform array device, and can reduce a cost since a process for producing uniform devices can be simplified.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. The present invention suggests a new concept of detection device in which, not the doped barrier layer is disposed in the vicinity of a quantum dot part, but quantum dots in the quantum dot part having a stack of alternative quantum dots and separating layers are doped with impurities, so that the quantum dot part itself absorbs infrared ray and serves as a channel for transferring electrons generated by the infrared ray absorption, for enhancing device performance and a device uniformity, and simplifying a device structure and a device fabrication process.

Figure 1:
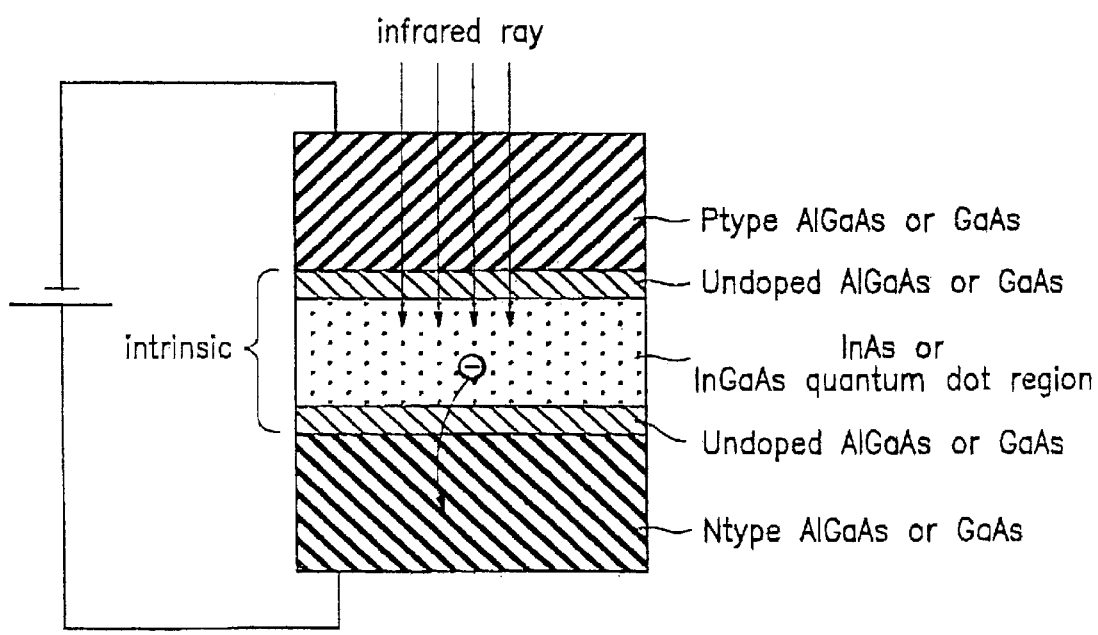
FIGS. 1 and 2 illustrate sections each showing a related art quantum dot infrared detection device.
Figure 2:
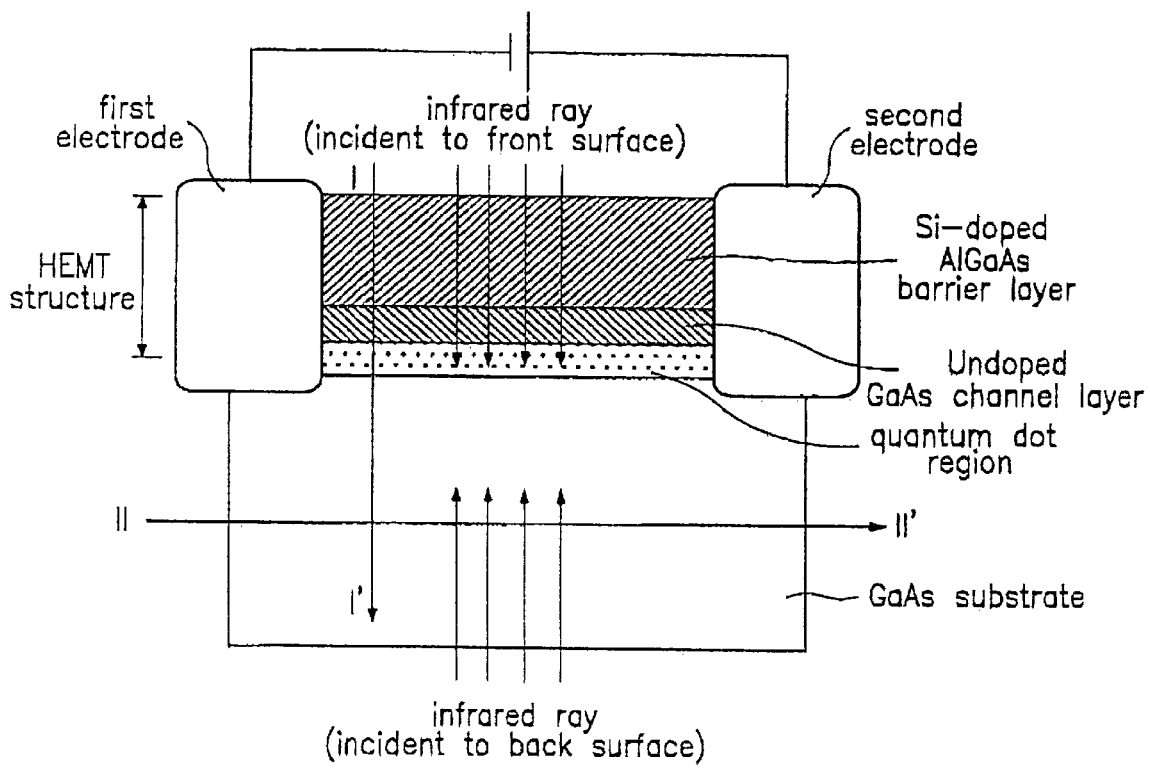
Figure 3:
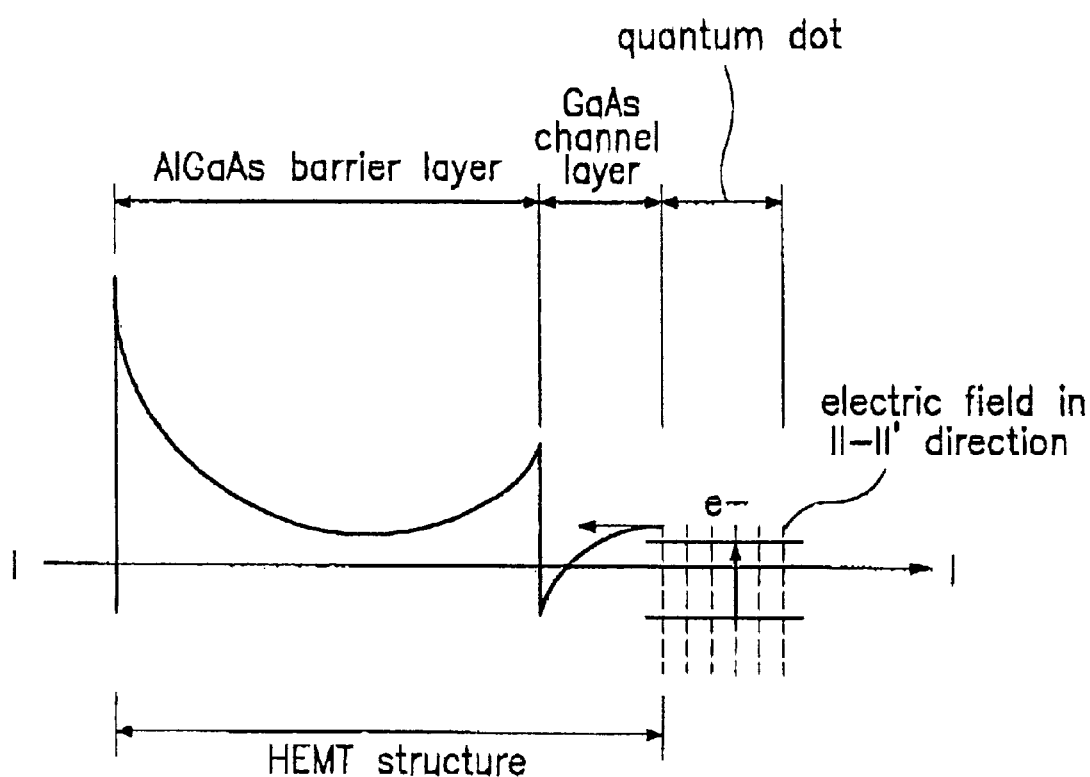
FIG. 3 illustrates a concept of a photo current of electrons produced by the inter-subband absorption in FIG. 2.
Figure 4:
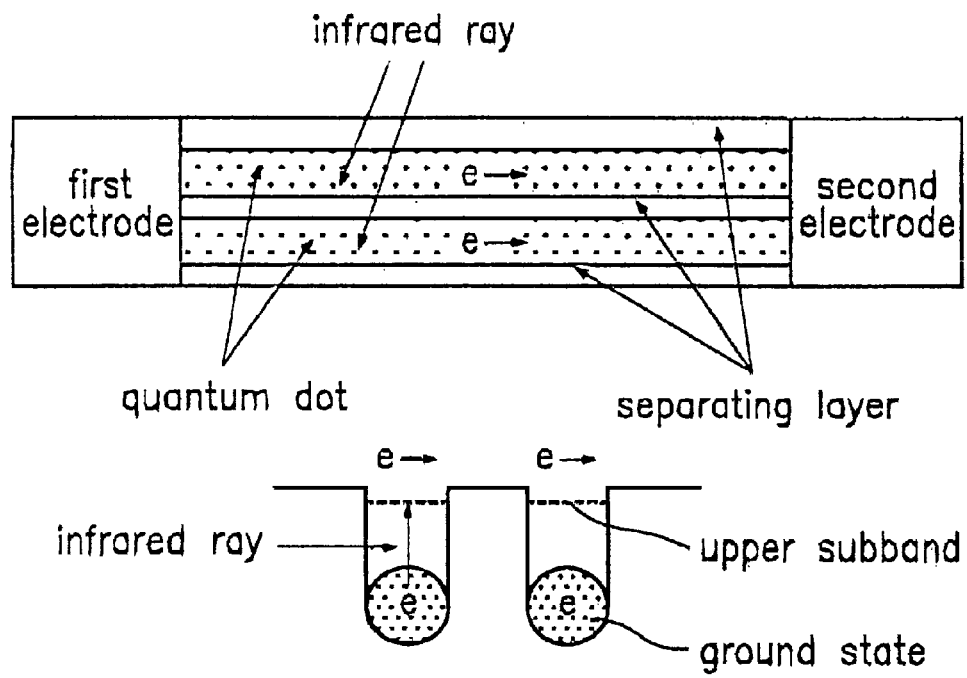
FIG. 4 illustrates a principle of a quantum dot infrared detection device of the present invention.

A basic principle of the present invention will be explained with reference to FIG. 4.

Figure 5:
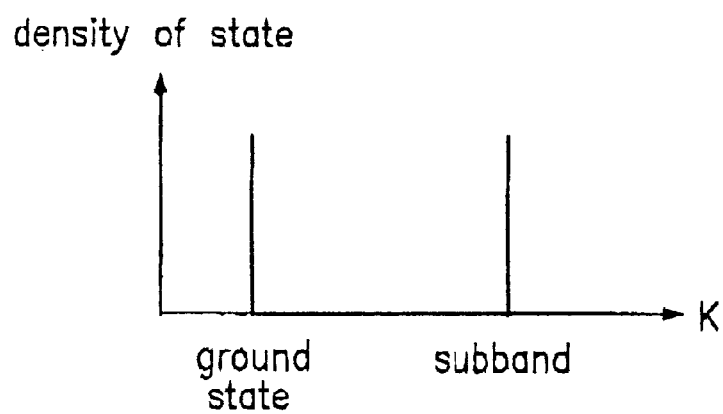
FIG. 5 illustrates a graph showing a state density of quantum dot of the present invention.
Figure 6:
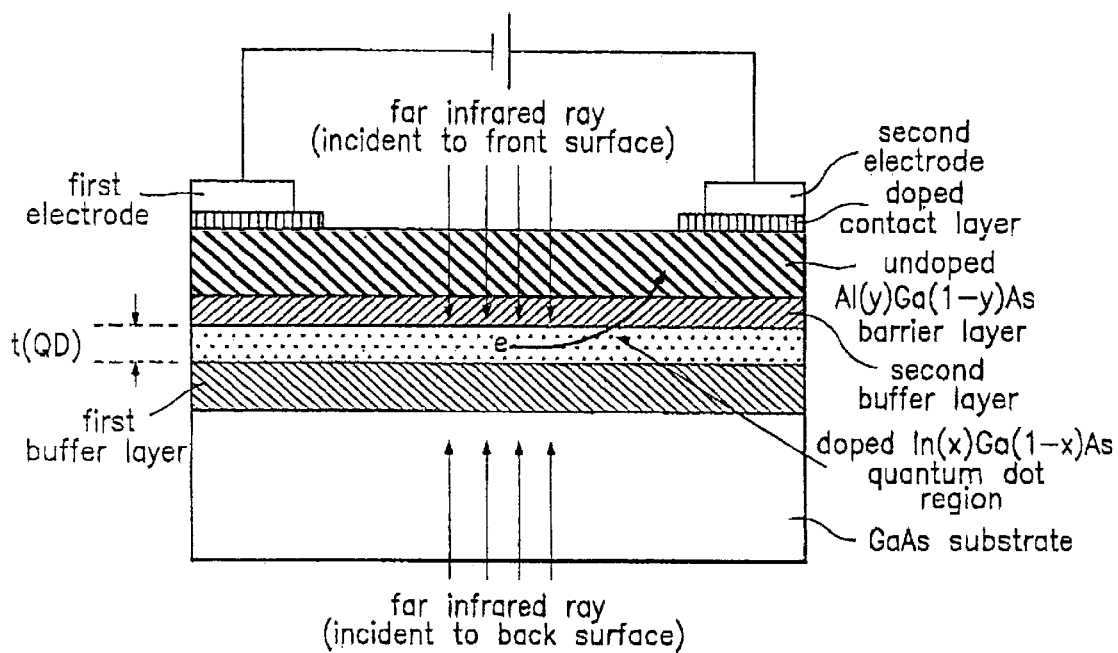
FIG. 6 illustrates a section showing a quantum dot infrared detection device in accordance with a first preferred embodiment of the present invention.

The basic structure of the present invention includes a doped quantum dot and undoped barrier layers on/under the quantum dot. That is, no impurity layer is formed around the quantum dot the same as in the related art, but the quantum dot itself is doped, with layers adjoining to the quantum dot made to be undoped hetero junction structures. The basic structure of the present invention formed thus will have full of required amount of electrons in the ground state of the quantum dot by the doped quantum dot, and, when infrared rays having energies corresponding to the ground state and an upper level subband are incident thereto, the electrons filled in the ground state are excited, to move to the upper level subband. That is, the present invention suggests a new concept of detection device principle in which, if a voltage is applied to the quantum dot in a lateral direction through electrodes, the excited electrons are captured to the electrodes along the quantum dot due to a voltage difference caused by the electrodes. In the basic structure of the present invention formed thus, the quantum dot absorbs the infrared ray and serves as a channel for transferring the electrons produced by the absorbed infrared ray. In this instance, as shown in FIG. 5, a density of state of the quantum dot has a delta function, by which a clear energy band state can be maintained even by using an extremely small electron density, to make the signal distinctive from an external noise signal. And, because the difference between the ground state and the subband is greater than an energy(kT=–26 meV) corresponding to a room temperature, a signal distinctive from environmental noise can be formed even at a room temperature. FIG. 6 illustrates a section showing a quantum dot infrared detection device in accordance with a first preferred embodiment of the present invention.

Referring to FIG. 6, the quantum dot infrared detection device in accordance with a first preferred embodiment of the present invention includes a first buffer layer grown on a substrate, a doped quantum dot part formed thereon, and a second buffer layer on the doped quantum dot part. The second buffer layer may be omitted. And, there is an undoped barrier layer on the second buffer layer, a doped contact layer having a portion of the doped contact layer removed therefrom, and electrodes on the doped contact layer.

Figure 7:
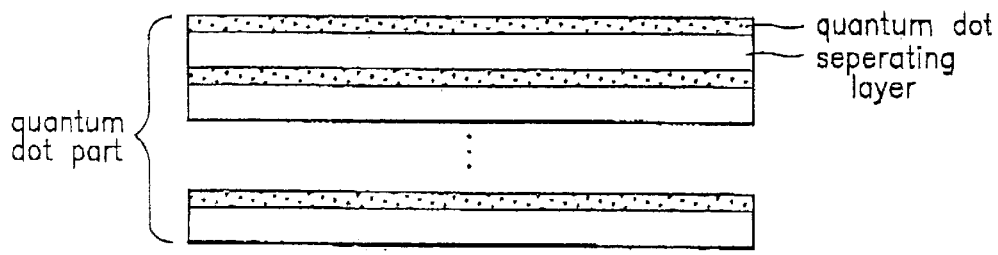
FIG. 7 illustrates a detail of the quantum dot part in FIG. 6.
Figure 8:
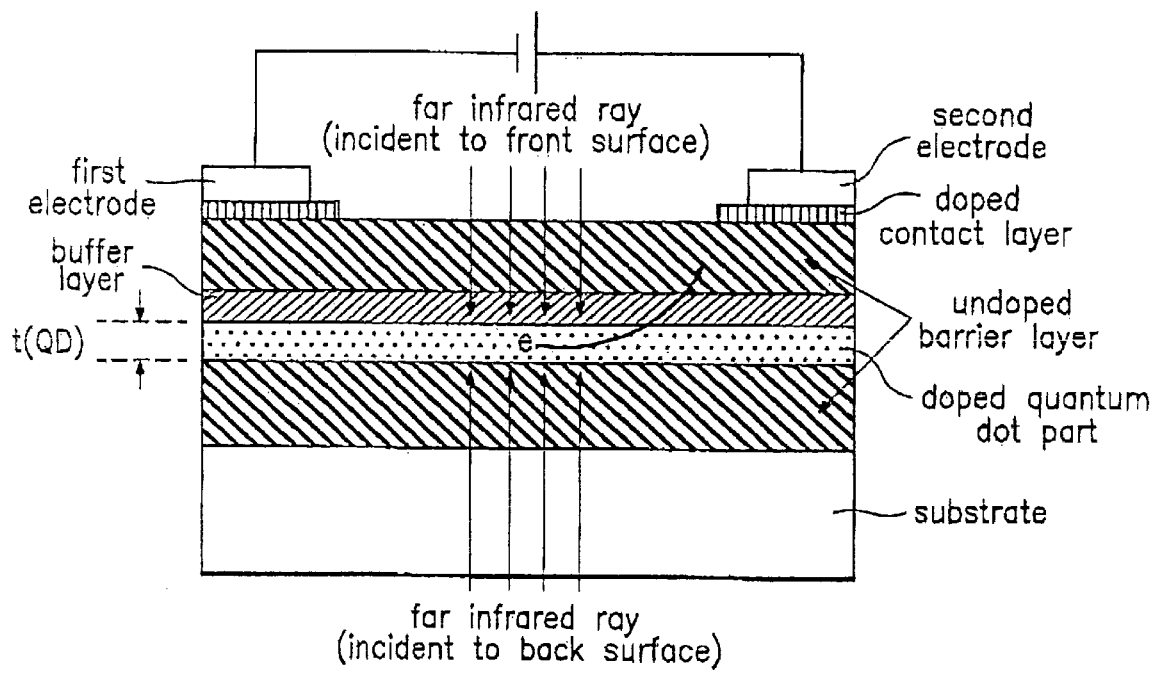
FIG. 8 illustrates a section showing a quantum dot infrared detection device in accordance with a second preferred embodiment of the present invention; and, FIG. 9 illustrates a section showing a quantum dot infrared detection device in accordance with a third preferred embodiment of the present invention.

Referring to FIG. 7, the quantum dot part has a multilayered structure of alternative stacking of a separating layer and a quantum dot. The quantum dot has a thickness of approx. 1~20 nm, and the separating layer has a thickness of approx. 0~50 nm for separating the quantum dots. The quantum dot is of 'n' type, and has an impurity concentration of $10^{15}/cm^3 \sim 10^{18}/cm^3$. And, if the substrate is formed of GaAs, the undoped barrier layer is formed of $Al_yGa_{1-y}As$ (where, $0 \leq y \leq 1$), the doped quantum dot in the quantum dot part is formed of $In_xGa_{1-x}As_y$ (where, $0<x<1$), the separating layer is formed of $Al_kGa_{1-k}As$ (where, $0 \leq k \leq 1$), and the buffer layer is formed of GaAs or AlGaAs. And, if the substrate is formed of InP, the quantum dot may be formed of $In_zGa_{1-z}As$, the separating layer may be formed of InP or AlInP, and the barrier layer may be formed of AlInP or InP, and, if the substrate is formed of Si, the quantum dot may be formed of SiGe, and the separating layer may be formed of Si. Other than these, if the substrate is formed of $Al_2O_3$ or GaN, the quantum dot may be formed of $In_nGa_{1-n}N$ (where, $0<n \leq 1$), the separating layer may be formed of $Al_mGa_{1-m}N$ (where, $0<m \leq 1$), and the barrier layer may be formed of GaN or AlGaN. Thus, depending on a material of the substrate, materials of the layers grown on the substrate may be varied. As shown in FIG. 6, because the quantum dot part produces electrons directly when an infrared ray incident to a front surface or back surface of the detection device, and directly transfers the electrons toward the electrodes, the quantum dot infrared detection device in accordance with a first preferred embodiment of the present invention has no loss of electrons, that improves a device performance. Because the quantum dot infrared detection device in accordance with a first preferred embodiment of the present invention has a structure which is not complicated the same as the related art, a fabrication process is easy. FIG. 8 illustrates a section showing a quantum dot infrared detection device in accordance with a second preferred embodiment of the present invention.

Figure 9:
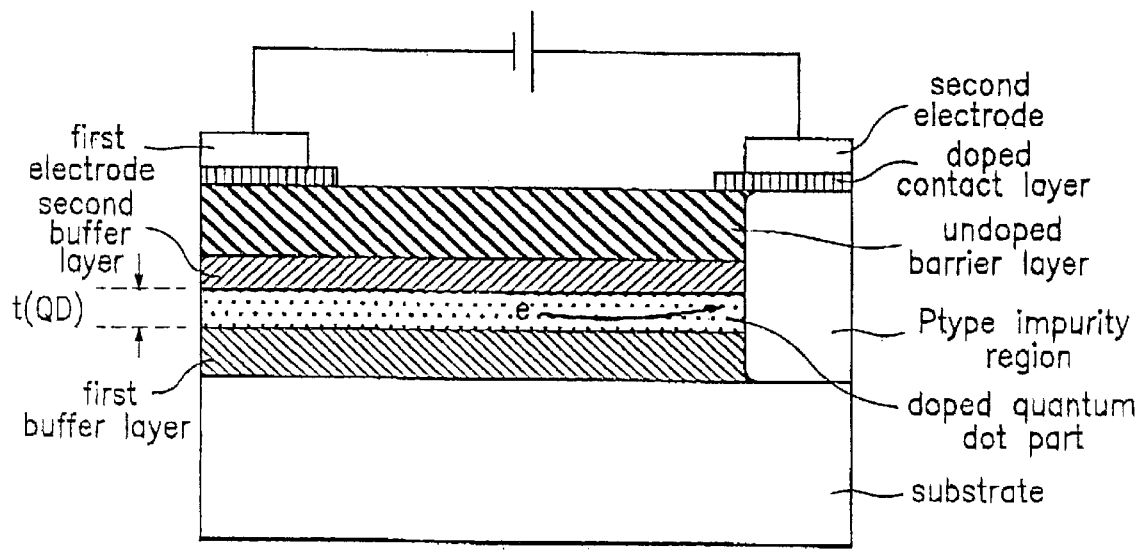

Referring to FIG. 8, the quantum dot infrared detection device in accordance with a second preferred embodiment of the present invention has a structure almost same with the first embodiment, except that the buffer layer in the first embodiment may be replaced with hetero junction barrier layers, and the barrier layers may be provided on top and bottom of the quantum dot part. The quantum dot infrared detection device in accordance with a second preferred embodiment of the present invention has advantages identical to the first embodiment. FIG. 9 illustrates a section showing a quantum dot infrared detection device in accordance with a third preferred embodiment of the present invention.

Referring to FIG. 9, a p type impurity region may be formed under one of electrodes additionally, for improving the effect. That is, if the p type impurity region is formed from a bottom of the p type doped contact layer to a surface of the substrate, and a reverse voltage is provided thereto, an interface of the doped quantum dot part and the p type impurity region has an inverted voltage, which minimizes a leakage current even if no infrared ray is incident thereto.

It will be apparent to those skilled in the art that various modifications and variations can be made in the quantum dot infrared detection device and method for fabricating the same of the present invention without departing from the spirit or scope of the invention. Thus, it is intended that the present invention cover the modifications and variations of this invention provided they come within the scope of the appended claims and their equivalents.

What is claimed is:

1. A quantum dot infrared detection device comprising:
    a substrate;
    a buffer layer on the substrate;
    a doped quantum dot part on the buffer layer;
    an undoped barrier layer on the quantum dot part; and,
    electrodes on regions of the undoped barrier layer.

2. A device as claimed in claim 1, further comprising a buffer layer between the undoped barrier layer and the quantum dot part.

3. A device as claimed in claim 1, further comprising a doped contact layer between the undoped barrier layer and the electrodes.

4. A device as claimed in claim 1, further comprising a p type doped layer under one of the electrodes.

5. A device as claimed in claim 1, wherein the substrate is formed of one selected from GaAs, InP, Si, $Al_2O_3$, and GaN, and the undoped barrier layer is formed of one selected from $Al_yGa_{1-y}As$ (where, $0 \leq y \leq 1$), AlInP, InP, Si, GaN, and AlGaN.

6. A device as claimed in claim 1, wherein the quantum dot part includes a multilayered structure of alternative stacking of a quantum dot and a separating layer.

7. A device as claimed in claim 6, wherein the quantum dot is formed of one selected from $In_xGa_{1-x}As$ (where, $0<x \leq 1$), SiGe, and $In_nGa_{1-n}N$ (where, $0<n \leq 1$), and the separating layer is formed of one selected from $Al_kGa_{1-k}As$ (where, $0 \leq k \leq 1$), Si, $Al_mGa_{1-m}N$ (where, $0 \leq m \leq 1$), InP, and AlInP.

8. A device as claimed in claim 6, wherein the quantum dot in the quantum dot part has a thickness of 1~20 nm, and the separating layer has a thickness of 0~50 nm for separating between the quantum dots.

9. A device as claimed in claim 6, wherein the electrodes have a distance of 1~1000 $\mu$m.

10. A quantum dot infrared detection device comprising:
    a substrate;
    an undoped barrier layer on the substrate;
    a doped quantum dot part on the undoped barrier layer;
    an undoped barrier layer on the quantum dot part; and,
    electrodes on regions of the undoped barrier layer.

11. A method for fabricating a quantum dot infrared detection device, comprising the steps of:
    (1) forming a buffer layer on a substrate, and forming a doped quantum dot part having at least one quantum dot and separating layer stacked alternatively;
    (2) forming an undoped barrier layer on the quantum dot part; and,
    (3) forming doped contact layers in regions of the undoped barrier layer, and forming electrodes thereon.

12. A method as claimed in claim 11, wherein, in the step (1), an undoped barrier layer is formed on the substrate in place of the buffer layer.

13. A method as claimed in claim 11, wherein the substrate is formed of one selected from GaAs, InP, Si, $Al_2O_3$, and GaN, the undoped barrier layer is formed of one selected from $Al_yGa_{1-y}As$ (where, $0<y \leq 1$), AlInP, InP, Si, GaN, and AlGaN, the quantum dot is formed of one selected from $In_xGa_{1-x}As$ (where, $0<x \leq 1$), SiGe, $In_nGa_{1-n}N$ (where, $0<n \leq 1$), the separating layer is formed of one selected from $Al_kGa_{1-k}As$ (where, $0 \leq k \leq 1$), Si, $Al_mGa_{1-m}N$ (where, $0 \leq m \leq 1$), InP, AlInP, and the buffer layer is formed of GaAs, AlGaAs, InP, and GaN.

14. A method as claimed in claim 11, wherein the quantum dot is of 'n' type, and has an impurity concentration of $10^{15}/cm^3 \sim 10^{18}/cm^3$.

15. A method as claimed in claim 11, further comprising the step of doping a portion under one of the doped contact layers with p type impurities to a depth.

* * * * *